US 6,715,118 B2

(12) United States Patent
Kaiser et al.

(10) Patent No.: US 6,715,118 B2
(45) Date of Patent: Mar. 30, 2004

(54) CONFIGURATION FOR GENERATING SIGNAL IMPULSES OF DEFINED LENGTHS IN A MODULE WITH A BIST-FUNCTION

(75) Inventors: Robert Kaiser, Kaufering (DE); Hans-Jürgen Krasser, München (DE); Florian Schamberger, Bad Reichenhall (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 387 days.

(21) Appl. No.: 09/781,208

(22) Filed: Feb. 12, 2001

(65) Prior Publication Data

US 2001/0018754 A1 Aug. 30, 2001

(30) Foreign Application Priority Data

Feb. 11, 2000 (DE) .......................... 100 06 236

(51) Int. Cl.[7] .................. G01R 31/317; G01R 31/3187
(52) U.S. Cl. ...................................... 714/724; 714/733
(58) Field of Search ................ 714/724, 738, 714/733–734; 324/763, 754; 365/194

(56) References Cited

U.S. PATENT DOCUMENTS

| 5,220,660 | A | * | 6/1993 | Yoshizawa et al. ......... 709/400 |
| 5,329,188 | A | * | 7/1994 | Sikkink et al. ............. 327/18 |
| 5,621,739 | A | * | 4/1997 | Sine et al. .................. 714/724 |
| 5,663,670 | A | * | 9/1997 | Iadanza et al. ............. 327/281 |
| 5,754,838 | A | * | 5/1998 | Shibata et al. .............. 713/600 |
| 6,075,395 | A | * | 6/2000 | Saeki .......................... 327/161 |
| 6,490,207 | B2 | * | 12/2002 | Manning .................... 365/194 |
| 6,499,334 | B1 | * | 12/2002 | Kobayashi .................. 73/1.42 |

FOREIGN PATENT DOCUMENTS

DE           4244696 C2      5/1995

OTHER PUBLICATIONS

Maximizing the weighted switching activity in combinational CMOS circuits under the variable delay model Manich, S.; Figueras, J.; European Design and Test Conference, 1997. ED&TC 97. Proceedings, Mar. 17–20, 1997 pp.: 597–602.*
On–chip picosecond delay measurement of RSFQ digital logic gates Brock, D.K.; Martinet, S.S.; Bocko, M.F.; Applied Superconductivity, IEEE Transactions on , vol.: 5 Issue: 2, Jun. 1995 pp.: 2844–2848.*

* cited by examiner

Primary Examiner—Albert Decady
Assistant Examiner—Cynthia Britt
(74) Attorney, Agent, or Firm—Laurence A. Greenberg; Werner H. Stemer; Gregory L. Mayback

(57) ABSTRACT

In the configuration, the module can "learn" one or more time intervals from the external tester and then repeat them internally or compare them to its own internally measured time intervals, for instance, for the purpose of evaluating whether the module in question has crossed a time specification value or remains below the value. The module can also measure and store one or more internal time intervals and transmit them to the external tester in digital or analog form.

4 Claims, 1 Drawing Sheet

CONFIGURATION FOR GENERATING SIGNAL IMPULSES OF DEFINED LENGTHS IN A MODULE WITH A BIST-FUNCTION

BACKGROUND OF THE INVENTION

Field of the Invention

The present invention relates to a configuration for generating signal impulses of defined pulse lengths in a module with a BIST function.

What is meant by a BIST (Built-In Self-Test) function is the capability of a module to subject the module or a part thereof—otherwise known as a DUT (Device Under Test)—to a self-test using logic that is integrated into the module. It is often a precondition of such a self-test that the DUT stores internally required signal impulses of defined lengths, also known as "separate time values", such as Trcd (rcd= RAS CAS Delay), namely the time value indicating how quickly information can be read from a cell field subsequent to the opening of a word line, or Tas (as=address set-up), i.e., an address set time value.

Hitherto, a tester has delivered the signal impulses of defined lengths, i.e., time values, to the DUT from outside. Such a tester is associated with various disadvantages, including the fact that the tester must be reapplied to the DUT for each test in which signal pulses of defined lengths are required. Such reapplication may necessitate numerous tester channels if different pins (terminals) are required for the application of the individual signal impulses of defined lengths. Variations in technologies or processes can lead to incorrect measurements when a plurality of testers are used to test a plurality of DUTs.

German Patent DE 4 244 696 C2 discloses a circuit for precision time adjustment. The circuit forms an output signal having a precisely controlled time edge based on an input signal having a rough time edge. By way of a data bus, an input data signal that specifies a desired programmed digital delay is written into an alpha register. The most significant bits of the value that is stored in the alpha register are applied to a tap or pick-off delay line in order to prescribe an approximate delay time. The least significant bits of the value that is stored in the alpha register are delivered as addresses to a RAM, which sends calibration data for an appertaining fine delay, likewise into the tap delay line, through a register. Based on the two items of data fed to it, the tap delay line combines the rough and fine delay times, producing the desired delay time. The delay line is then reset with a flip-flop and a phase detector such that the edges of the output signal having the finely adjusted edge and the edge of the timing signal are aligned with one another. The result of the calibration process is stored in the RAM and the register. It is, thus, possible to execute a self-test of the circuit during the production test process by way of the calibration process.

In addition, U.S. Pat. No. 5,621,739 to Sine et al. discloses a buffer circuit having a delay chain with an adjustable delay. The delay chain is made of a series circuit composed of inverters.

SUMMARY OF THE INVENTION

It is accordingly an object of the invention to provide a configuration for generating signal impulses of defined lengths in a module with a BIST-function that overcomes the hereinafore-mentioned disadvantages of the heretofore-known devices of this general type and that improves the configuration such that it is able to generate the signal impulses of defined lengths on the module itself. Therefore, the configuration has a simple construction.

With the foregoing and other objects in view, in a module with a BIST function to which signal pulses are fed from outside with a tester there is provided, in accordance with the invention, a configuration for generating signal impulses of defined lengths including registers configured to store measured pulse lengths, and a variable delay element configured to measure pulse lengths of externally supplied signal pulses in a training phase, the variable delay element having a series circuit of inverters and delay-free signal paths parallel to the inverters for writing into the registers and reading out from the registers.

In accordance with another feature of the invention, the delay-free signal paths include a delay-free write signal path, a decoder and AND gates having outputs are included. The AND gates are disposed between the delay-free write signal path and the variable delay element and behind an even number of respective inverters, and the output of the AND gates are connected to the registers through the decoder.

In accordance with a concomitant feature of the invention, the delay-free signal paths include a delay-free read signal path, and a decoder and AND gates having inputs and outputs are included. The AND gates are disposed between the delay-free read signal path and the variable delay element and behind an even number of respective inverters. One input of each of the AND gates is connected to the registers through the decoder, another input of the AND gates is connected to the variable delay element, and the outputs of the AND gates are connected to the delay-free read signal path.

The invention makes possible the delivery of signal impulses of defined lengths—that is to say, the delivery of separate time values—in a surprisingly simple manner: at the beginning of a test, the external tester initially feeds the required signal impulses of defined lengths to the module (i.e., the DUT). From these signal impulses, the module measures a first time interval in its own variable delay element and stores the result in a corresponding register. The action then occurs for all required defined pulse lengths, i.e., for Trcd, Tas, and so on. All in all, the process requires as many registers as defined pulse lengths.

The module can then independently generate the required and defined pulse lengths as needed for calibration purposes and for measuring out signal transit times, without requiring the tester again. But it is also possible for the module to measure out signal transit times itself and then to transmit them to the tester in analog or digital form.

The configuration of the invention makes possible a number of advantages that cannot be achieved with existing configurations in which signal impulses of defined lengths are delivered by external testers alone.

External testers need to apply each signal impulse of defined length only once. To calibrate the configuration, tester channels can be spared because a maximum of two pins are needed to accomplish the calibration, through which all defined pulse lengths (i.e., separate time values) can be applied by the external tester. Once saved, the pulse lengths (i.e., the times) can be stored on the module until the next test run and then reproduced without further ado. Faulty measurements due to variations in technology or processing that occur in the production of different testers and modules are practically non-existent. Only one variable delay element is needed on the module itself as reference measure and for the measuring procedure. The element is also used for all measurements of the various definite pulse lengths, i.e., separate time values. Using the registers, the module can store the different definite pulse lengths (i.e., separate time values) without further ado and can potentially even output them to the external tester as needed.

Essential to the present invention is, first, the use of only one variable delay element that measures the pulse lengths, i.e., times, that have been impressed in the module by the external tester or that measures out internally generated pulse lengths (i.e., times), and that stores the results in the respective registers. Conversely, the desired time interval can be reproduced again on the module itself using the variable delay element and the corresponding register value. The variable delay element is inventively realized using inverter transit times. The dimensioning of the individual inverters, for example, is dependent upon the smallest desired resolution: the more inverters with short transit times that are used, the higher the time resolution will be. A variable delay element of a "mixed" construction may also be advantageous when large time intervals must be measured with high precision. It is expedient to provide short transit times for the large time intervals after longer transit times in the region of the beginning and end of the large time intervals, so that these can be measured precisely.

In the inventive configuration, the module can "learn" one or more time intervals from the external tester and then repeat them internally or compare them to its own internally measured time intervals, for instance, for the purpose of evaluating whether the module in question has crossed a time specification value or remains below the value. Finally, the module can also measure and store one or more internal time intervals and transmit them to the external tester in digital or analog form.

The inventive configuration can also be employed advantageously for a normal operation of modules, i.e., chips. It is then possible to externally prescribe to a chip its desired time response, which can also occur during a chip operation.

Other features that are considered as characteristic for the invention are set forth in the appended claims.

Although the invention is illustrated and described herein as embodied in a configuration for generating signal impulses of defined lengths in a module with a BIST-function, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWING

The FIGURE of the drawing is a schematic circuit diagram of configuration according to the invention with a variable delay element.

DESCRIPTION OF THE PREFERRED EMBODIMENTS

Figure 1:
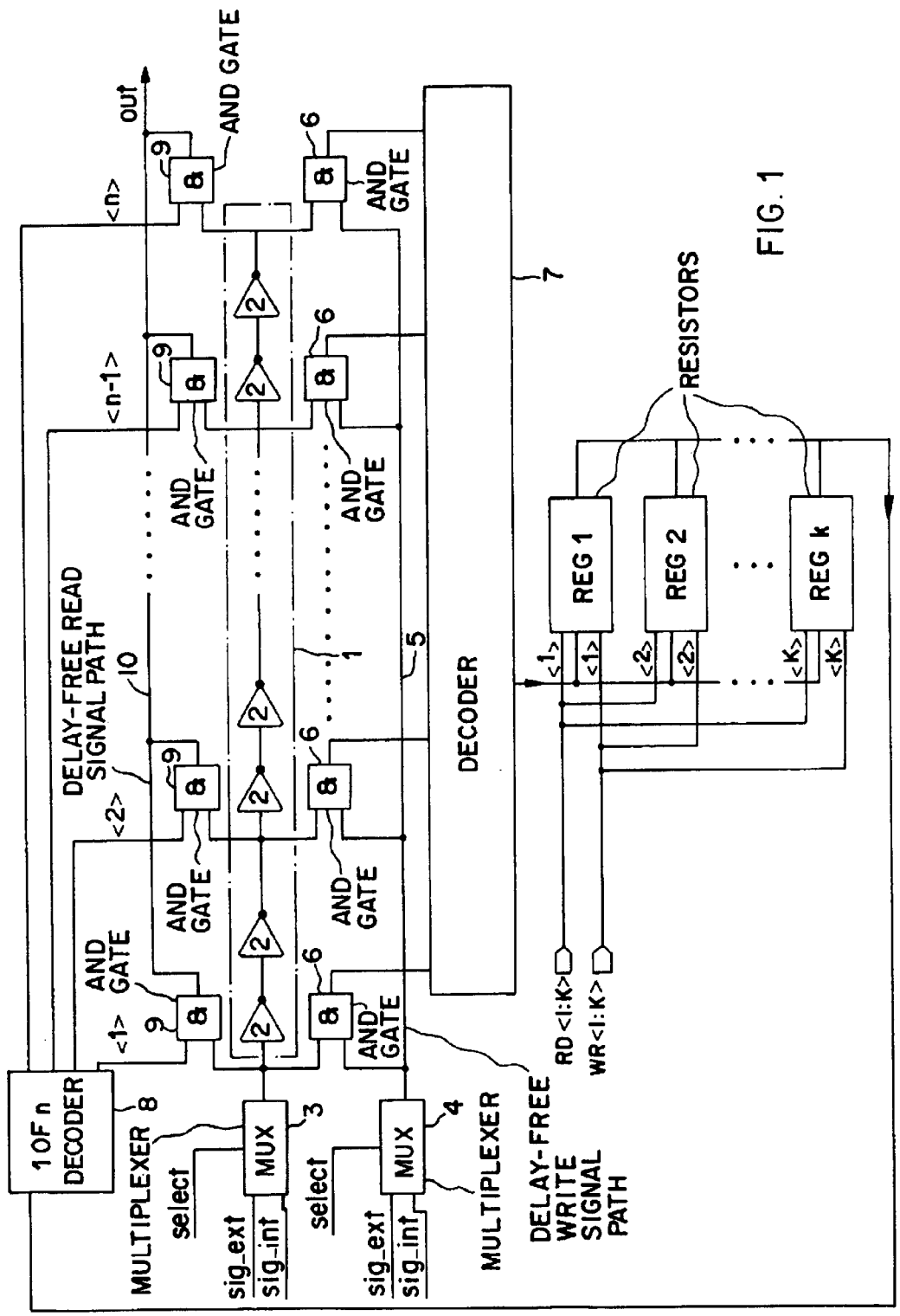

Referring now to the single FIGURE of the drawing, it is seen that the configuration of the invention includes a variable time or delay element 1, which is made of a number of inverters 2 that are connected to one another in series. A tap follows an even number of inverters 2 in the series circuit. Through each tap, the signal that is delayed to the tap by the inverter 2 is conducted out.

To "train" the configuration, an external tester applies an external signal sig_ext to multiplexers 3, 4, which can be switched by a control signal select to an internal signal sig_int, which will be described more extensively below.

The external signal sig_ext is an impulse with a leading edge that is followed at a definite interval by a trailing edge in order to define a pulse length as the time value or time interval. The external signal sig_ext goes to the input of the variable delay element 1 through the multiplexer 3 and simultaneously to a delay-free signal path 5 that runs parallel to the variable delay element 1 through the multiplexer 4. Consequently, both the external signal that has been delayed by the variable delay element 1 and the external signal sig_ext that remains undelayed over the signal path 5 stand at AND gates 6 that are connected between the input of the variable delay element 1, that is to say taps thereof, and the delay-free signal path 5. Thus, the external signal sig_ext traverses the variable delay element 1 delayed, whereas it experiences no delay in the delay-free signal path 5. The pulse length, i.e., the interval of the external signal sig_ext, is then measured by determining the tap at which the corresponding AND gate 6 receives the same input signals, e.g., "0", even when the external signal has dropped to 0 again at this location. That is to say, as soon as the external signal sig_ext goes to 0 at a tap in the variable delay element 1, the corresponding AND gate 6 delivers an output signal to a decoder 7, which then stores an item of data corresponding to the measured time value in an appertaining register Reg 1, Reg 2, ..., Reg k.

Through the input sig_int, a signal that is generated internally on the module can be fed into the multiplexers 3 and 4 and compared to the time values already stored in the registers Reg 1, Reg 2, ..., Reg k. Comparison is possible particularly when a sufficient number of defined pulse lengths (i.e., time values) have been previously stored in the registers Reg 1, Reg 2, ..., Reg k by the application of corresponding external signals sig_ext so as to enable a sufficiently precise comparison. The readout of the registers Reg 1, Reg 2, ..., Reg k that are controllable by read and write command signals RD and WR, respectively, is accomplished in the "reverse" manner to the write process: subsequent to applying the read command signal RD, the registers Reg 1, Reg 2, ..., Reg k are read out through a decoder 8 (1 of n decoders) that feeds the contents of the registers to allocated AND gates 9 of an additional delay-free signal path 10. As such, the AND gate 9 corresponding to the duration that is stored in the appertaining register Reg 1, Reg 2, ..., Reg k is opened, and a signal with the stored duration is obtained at the output OUT by way of the variable delay element 1.

We claim:

1. In a module with a BIST function, a configuration comprising:

a variable delay element configured for obtaining measured pulse lengths by measuring pulse lengths of signal pulses being supplied by an external tester, said variable delay element including a plurality of inverters connected in series;

a plurality of registers, each one of said plurality of registers for storing a respective one of said measured pulse lengths;

a delay-free write signal path for writing to said plurality of registers; and a delay-free read-out signal path for reading out said plurality of registers;

said delay-free signal write path and said delay-free read-out signal path configured parallel to said plurality of inverters of said variable delay element.

2. The configuration according to claim 1, further comprising:

a decoder; and a first group of AND gates having outputs;

said first group of AND gates disposed between said delay-free write signal path and said variable delay element; and each one of said AND gates of said first group configured behind an even number of said plurality of inverters;

said decoder connecting said outputs of said first group of AND gates to said plurality of registers.

3. The configuration according to claim 2, further comprising:

a decoder; and a second group of AND gates disposed between said delay-free read signal path and said variable delay element;

each one of said AND gates of said second group configured behind an even number of said plurality of inverters;

each one of said AND gates of said second group having one input connected to one of said plurality of said registers through said decoder;

each one of said AND gates of said second group having another input connected to said variable delay element; and each one of said AND gates of said second group having an output connected to said delay-free read signal path.

4. The configuration according to claim 1, further comprising:

a decoder; and a second group of AND gates disposed between said delay-free read signal path and said variable delay element;

each one of said AND gates of said second group configured behind an even number of said plurality of inverters;

each one of said AND gates of said second group having one input connected to one of said plurality of said registers through said decoder;

each one of said AND gates of said second group having another input connected to said variable delay element; and each one of said AND gates of said second group having an output connected to said delay-free read signal path.

* * * * *